United States Patent
Lan

(10) Patent No.: US 12,448,995 B2
(45) Date of Patent: Oct. 21, 2025

(54) SCREW FIXING STRUCTURE FOR HEAT DISSIPATION UNIT AND HEAT DISSIPATION UNIT USING SAME

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 248 days.

(21) Appl. No.: 18/202,955

(22) Filed: May 29, 2023

(65) Prior Publication Data

US 2024/0401632 A1    Dec. 5, 2024

(51) Int. Cl.
*H01L 23/40*  (2006.01)
*F16B 39/10*  (2006.01)
(Continued)

(52) U.S. Cl.
CPC ........... *F16B 39/10* (2013.01); *H05K 7/2039* (2013.01); *F16B 21/186* (2013.01); *F16B 41/002* (2013.01); *F16F 2226/04* (2013.01)

(58) Field of Classification Search
CPC ...... F16B 41/002; F16B 21/186; F16B 43/00; F16F 2226/04; H01L 2023/4087; H01L 23/4006
(Continued)

(56) References Cited

U.S. PATENT DOCUMENTS 2,948,317 A * 8/1960 Munro ................. F16B 41/002
411/352
2,967,557 A * 1/1961 Tait ....................... F16B 5/0208
411/999
(Continued)

FOREIGN PATENT DOCUMENTS

CN    101039564 A    9/2007
CN    101132682 A    2/2008
(Continued)

OTHER PUBLICATIONS

Search Report dated Mar. 4, 2024 issued by Taiwan Intellectual Property Office for counterpart application No. 112117163.
(Continued)

*Primary Examiner* — Flemming Saether
(74) *Attorney, Agent, or Firm* — Demian K. Jackson; Jackson IPG PLLC

(57) ABSTRACT

A heat dissipation unit includes a heat sink having a heat receiving zone and a screw fixing structure extended through each of four holes on the heat sink outside the heat receiving zone. The screw fixing structure includes a locating screw having a shank and a spring fitted around the shank; a hollow sleeve located outside the shank and the spring; and a spring stopper including two parallel elastic arms connected at one end and elastically disposed in the hollow sleeve to hold the spring in a compressed state. The spring stopper may be pushed downward to laterally push the two elastic arms open to move away from the spring, allowing the spring to release (Continued)

its elastic force upwardly. The four locating screws can synchronously and evenly apply their elastic force to the through holes outside the heat receiving zone, preventing the heat sink from damaging a contacted heat source.

20 Claims, 15 Drawing Sheets

(51) Int. Cl.
    *H05K 7/20*     (2006.01)
    *F16B 21/18*     (2006.01)
    *F16B 41/00*     (2006.01)

(58) Field of Classification Search
    USPC ............... 411/352, 353, 999, 544, 520–521;
    267/69–74
    See application file for complete search history.

(56) References Cited

U.S. PATENT DOCUMENTS

| | | | |
|---|---|---|---|
| 3,314,696 A * | 4/1967 | Ferguson | F16L 37/0885 |
| | | | 285/305 |
| 3,343,581 A * | 9/1967 | Martin | F16B 5/0208 |
| | | | 292/251 |
| 6,468,011 B2 * | 10/2002 | Mayer | F16B 21/18 |
| | | | 411/153 |
| 6,955,512 B2 * | 10/2005 | Allen | H05K 7/14 |
| | | | 211/26 |
| 8,454,287 B2 * | 6/2013 | Ye | H01L 23/4006 |
| | | | 411/353 |
| 8,511,956 B2 * | 8/2013 | Liu | H01L 23/4006 |
| | | | 411/107 |
| 8,979,458 B2 * | 3/2015 | Sun | H01L 23/4006 |
| | | | 411/353 |
| 2009/0142158 A1 * | 6/2009 | Dai | F16B 41/002 |
| | | | 411/353 |
| 2012/0195711 A1 | 8/2012 | Chiu | |
| 2024/0401633 A1 * | 12/2024 | Lan | H05K 7/2039 |
| 2024/0402766 A1 * | 12/2024 | Lan | G06F 1/183 |
| 2024/0402769 A1 * | 12/2024 | Lan | G06F 1/183 |

FOREIGN PATENT DOCUMENTS

| | | |
|---|---|---|
| CN | 101765348 A | 6/2010 |
| CN | 211017061 U | 7/2020 |
| CN | 211951083 U | 11/2020 |
| CN | 217814448 U | 11/2022 |
| CN | 219549297 U | 8/2023 |
| KR | 20020007431 A | 1/2002 |
| TW | M646374 U | 9/2023 |

OTHER PUBLICATIONS

Search Report dated May 26, 2025 issued by China National Intellectual Property Administration for counterpart application No. 2023105156956.

* cited by examiner

SCREW FIXING STRUCTURE FOR HEAT DISSIPATION UNIT AND HEAT DISSIPATION UNIT USING SAME

FIELD OF THE INVENTION

The present invention relates to a screw fixing structure, and more particularly, to a screw fixing structure, a plurality of which can synchronously apply downward and even elastic forces to four corners outside a heat receiving zone on a heat sink, such that a bare die computing chip in contact with the heat sink is not subjected to damage and/or thermal resistance due to forces unevenly applied thereto. The present invention also relates to a heat dissipation unit using the screw fixing structure.

BACKGROUND OF THE INVENTION

Nowadays, high performance and high power chips are used in electronic devices for the latter to provide highly enhanced computing power. The chip in processing data will produce a relatively high amount of heat to form a heat source. Conventionally, the data processing chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Therefore, many currently available chips are provided in the form of bare dies without any package to protect their surfaces. The non-packaged bare die has a non-smooth and convex surface and accordingly, has a relatively small and weak contact area between it and a heat dissipation device for heat exchange. Thus, the bare die is subjected to damage and breaking when the heat dissipation device is connected thereto. Conventionally, to fix the heat dissipation device to a top of the heat source (i.e. the bare die), fixing points on the heat dissipation device are usually located corresponding to four corners outside the heat source. Since the four corners outside the bare die provide relatively small contact areas and the heat dissipation device is conventionally connected to the fixing points one by one, the heat dissipation device in contact with the heat source tends to be skewed relative to the latter. The bare die subjected to uneven distribution of pressure over it is easily broken and damaged.

Please refer to FIGS. 12 and 13, which show a conventional manner of fixing a heat dissipation device C to a heat source A that is in the form of a bare die. As shown, four corners outside the heat source A are provided with an internally threaded copper sleeve rod B each. The heat dissipation device C also has four holes C3 formed correspondingly to the four copper sleeve rods B for a screw unit C1 to extend through each of the holes C3. Each of the screw units C1 has a spring C2 fitted therearound.

To lay and connect the heat dissipation device C to a top of the heat source A, the screw units C1 are sequentially threaded through the holes C3 into corresponding copper sleeve rods B one by one with a power screwdriver handled manually or by a mechanical arm. To shorten the fixing time on a production line and complete the fixing operation within a limited time, each of the screw units C1 is fully tightened in one movement at a very quick speed. As soon as the screw unit C1 is fully tightened, the spring C2 fitted therearound is also compressed in a direction toward the heat source A. The screw units C1 individually tightened at a quick speed and the springs C2 quickly compressed toward the heat source A tend to result in uneven and asynchronous distribution of downward forces over four corners of the heat source A, preventing the heat dissipation device from completely and fitly contacting with the top of the bare die A. As a result, the heat source A, i.e. the bare die, being fragile and breakable, is easily damaged under uneven force application thereto.

The bare die is so fragile that even downward forces must be synchronously applied by the heat dissipation device to the four corners of the bare die to ensure successful fixing of the heat dissipation device to the top of the bare die. In the event the four corners of the bare die are subjected to unevenly and asynchronously applied forces from the heat dissipation device, warp of the bare die or the heat dissipation device might occur to cause incomplete contact and thermal resistance between the two parts. In some worse conditions, the warped bare die might become damaged and non-usable and the thermal resistance might lead to uneven heat distribution over or inactive heat conduction of the heat dissipation device.

It is therefore tried by the inventor to find ways to enable the heat dissipation device to apply even and synchronous forces to the heat source to ensure complete and close contact between them and to maintain a proper binding force between the bare die and the heat dissipation device with reliable fixing means.

SUMMARY OF THE INVENTION

To effectively solve the above problems, it is a primary object of the present invention to provide a screw fixing structure for heat dissipation unit. A plurality of such screw fixing structures can be manipulated to synchronously provide even downward forces to the heat dissipation unit, so as to avoid the problem of broken or collapsed edges of the bare die as would occur in the prior art that the screw units are sequentially tightened one by one.

To achieve the above and other objects, the screw fixing structure for heat dissipation unit according to the present invention includes:

a locating screw including a shank having a head and an externally threaded section formed on an upper and a lower end thereof, respectively; and the shank further including a retaining groove provided near the threaded section for receiving a retaining ring therein and having a spring fitted on around it;

a hollow sleeve internally defining a receiving space between an upper and a lower end thereof and further having a neck portion formed near the upper end; the neck portion having a pair of cuts correspondingly formed thereat, and a first and a second stepped section formed below the pair of cuts; the cuts being radially communicable with the receiving space; and the shank of the locating spring having the spring fitted on around it being received in and axially extended through the receiving space of the hollow sleeve; and a spring stopper being elastically tightly set in the pair of cuts on the hollow sleeve and including a first and a second elastic arm, which are correspondingly shaped and located parallel to each other; the first elastic arm and the second elastic arm respectively having an end connected to one of two ends of a link section located between them, and another end of the first and the second elastic arm located far away from the link section being defined as a first end and a second end, respectively; the first end and the second end being located adjacent to but not physically connected to each other; and the first and the second elastic arm being pressed into the receiving space of the hollow sleeve via the pair of cuts to abut on and stop the spring from elastically pushing upward, keeping the spring in a compressed state.

When the spring stopper is pushed downward by an external object, the first and second elastic arms are brought to laterally move outward and a distance between the two elastic arms is gradually increased, the laterally outward moved first and second elastic arms no longer abut on a top end of the spring, allowing the spring to release an elastic force.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
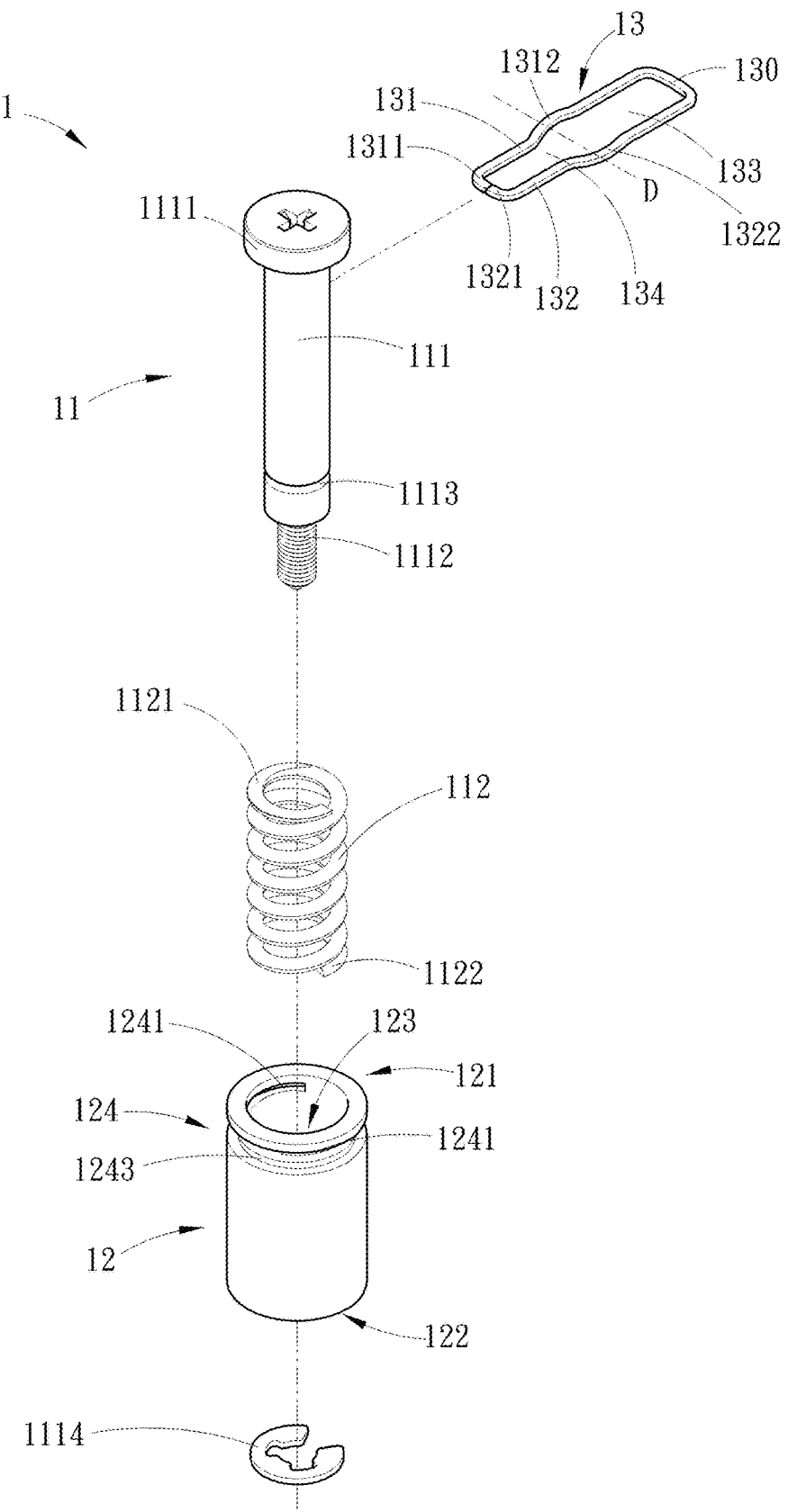
FIG. 1 is an exploded perspective view of a screw fixing structure for heat dissipation unit according to a preferred embodiment of the present invention.
Figure 2:
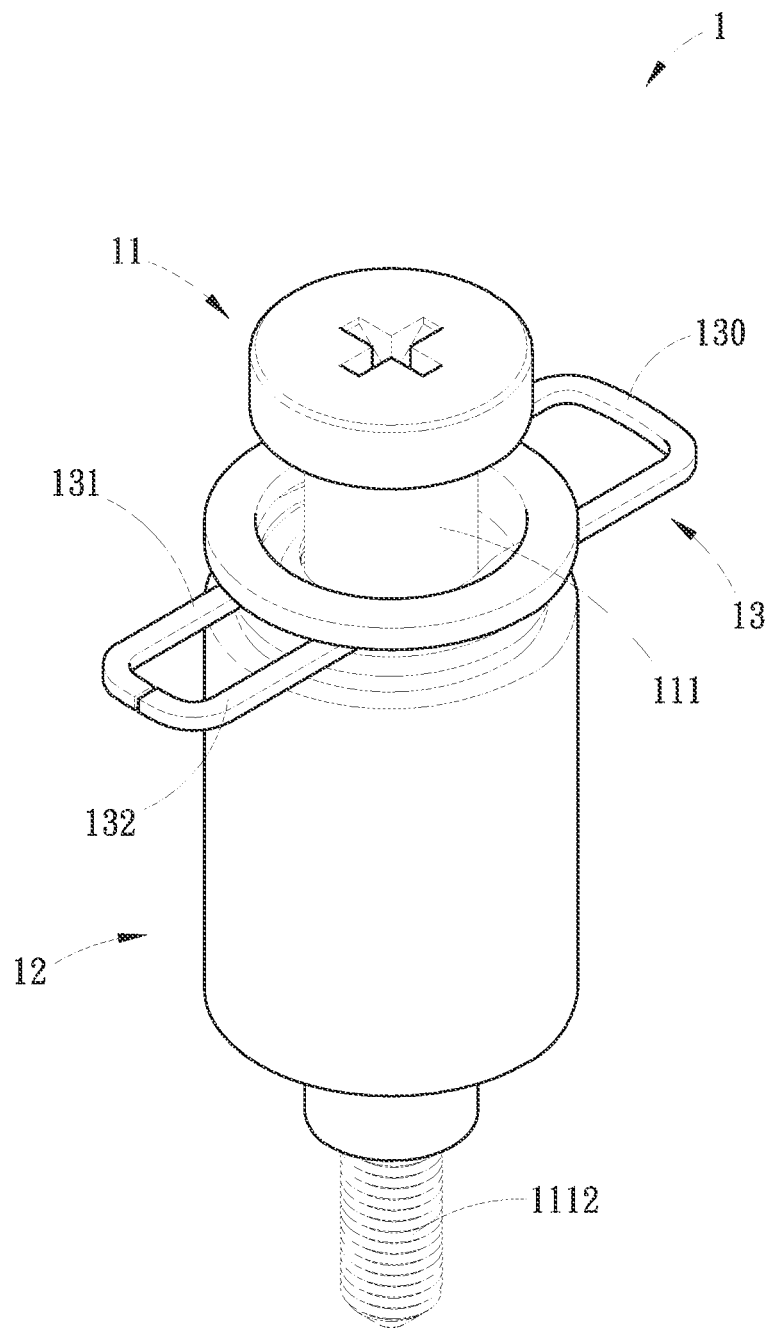
FIG. 2 is an assembled view of the screw fixing structure of FIG. 1.
Figure 2A:
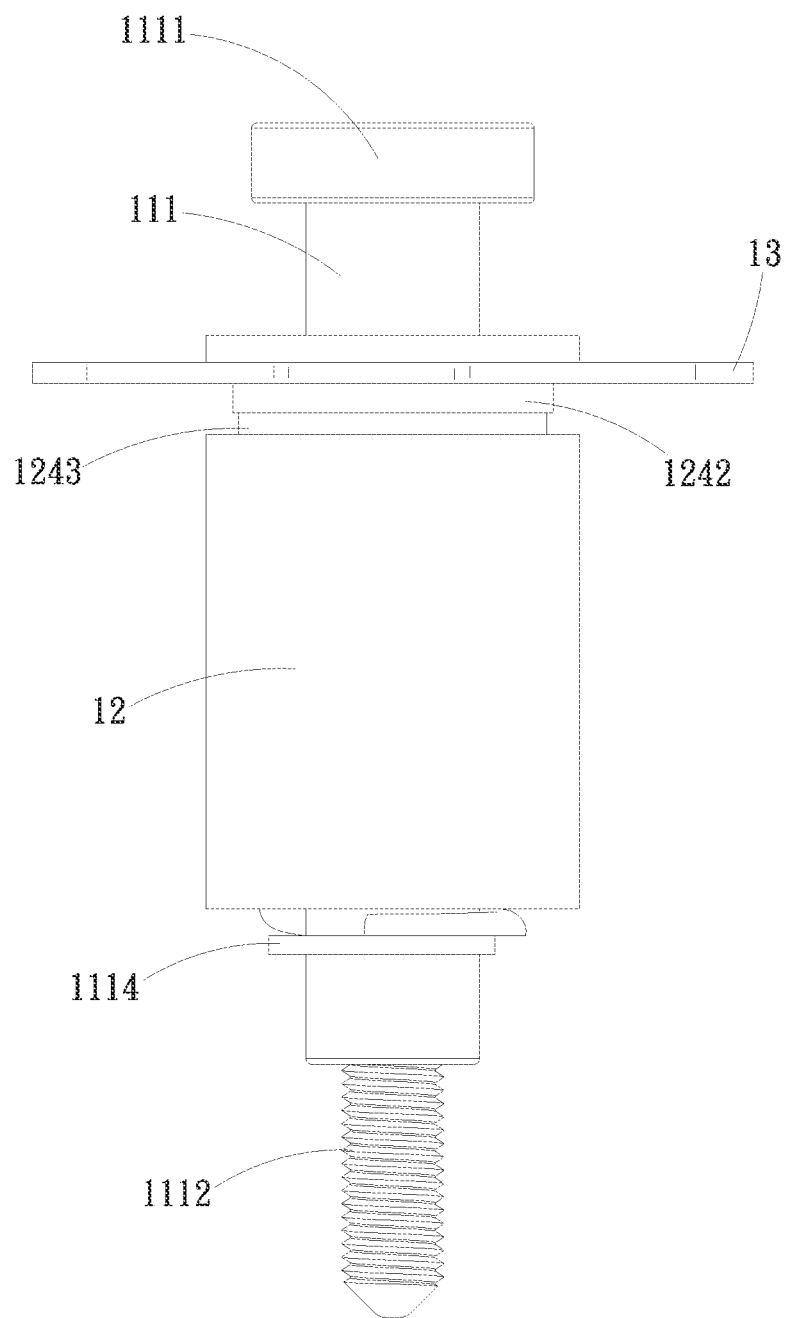
FIG. 2A is an assembled side view of the screw fixing structure of FIG. 1.
Figure 3:
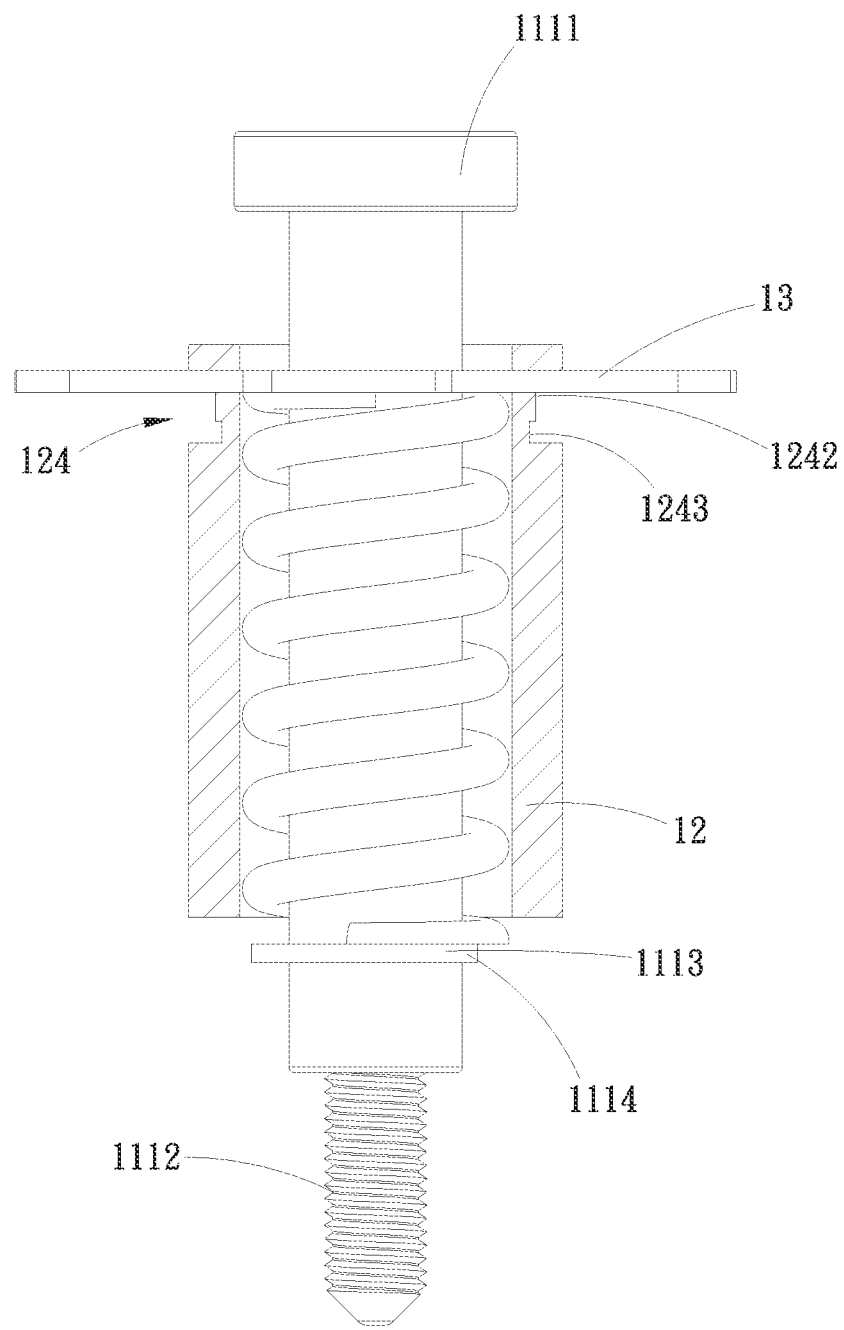
FIG. 3 is an assembled sectional side view of the screw fixing structure of FIG. 1.

The present invention will now be described with some preferred embodiments thereof. For the purpose of easy to understand, elements that are the same in the preferred embodiments are denoted by the same reference numerals.

Please refer to FIGS. 1 to 11, in which a screw fixing structure for heat dissipation unit according to a preferred embodiment of the present invention is shown. The screw fixing structure is generally denoted by reference numeral 1 and includes a locating screw 11, a hollow sleeve 12, and a spring stopper 13.

The locating screw 11 includes a shank 111 having an upper and a lower end provided with a head 1111 and an externally threaded section 1112, respectively. The shank 111 further includes an annular retaining groove 1113 provided near the threaded section 1112 for receiving a retaining ring 1114 therein. A spring 112 is fitted on around the shank 111 and it is so arranged that it can move along the shank 111 of the locating screw 11 when being compressed or released. That is, when the spring 112 is released from a compressed state, it would not move in other undesired directions. The spring 112 has a top end 1121 and a bottom end 1122, and the bottom end 1122 of the spring 112 is pressed against the retaining ring 1114. In an embodiment of the present invention, the locating screw 11 is designed to be screwed and fixed to other device or structure, including, but not limited to, an internally threaded joining section provided on another device or structure corresponding to the externally threaded section 1112, so that the locating screw 11 is prevented from loosening from or moving out of the joining section.

The hollow sleeve 12 has an upper end 121, a lower end 122, and a receiving space 123 defined in the hollow sleeve 12 between the upper and the lower end 121, 122. The hollow sleeve i2 further has a radially inward narrowed neck portion 124 formed near the upper end 121. The neck portion 124 includes a pair of cuts 1241, a first stepped section 1242, and a second stepped section 1243. The hollow sleeve 12 has an outer diameter larger than that of the neck portion 124, and the first stepped section 1242 of the neck portion 124 has an outer diameter larger than that of the second stepped section 1243, such that the neck portion 124 has an inverted stepped profile. The two cuts 1241 are located diametrically opposite to each other and are radially communicable with the receiving space 123; and the first and the second stepped section 1242, 1243 are sequentially located below the two cuts 1241 and can be designed to be communicable with the receiving space 123 or not. The hollow sleeve 12 is located around an outer side of the shank 111 and the spring 112 of the locating screw 11. That is, the shank 111 and the spring 112 are set in the receiving space 123 of the hollow sleeve 12. The hollow sleeve 12 prevents foreign matters from entering the receiving space 123 to hinder the compression or release of the spring 112 and adversely affect the function of the spring 112.

The spring stopper 13 is elastically tightly set in the pair of cuts 1241 on the hollow sleeve 12, and includes a first elastic arm 131 and a second elastic arm 132 that are correspondingly shaped and located parallel to each other. The first elastic arm 131 and the second elastic arm 132 respectively have an end connected to one of two ends of a link section 130 located between them. Another end of each of the first and the second elastic arm far away from the link section 130 is defined as a first end 1311 and a second end 1321, respectively. It is noted the first and the second end 1311, 1321 are closely located adjacent to but not physically connected to each other.

An area enclosed in the first elastic arm 131, the second elastic arm 132, the link section 130, the first end 1311, and the second end 1321 of the spring stopper 13 is divided by a virtual line D into a first zone 133 and a second zone 134.

The first and the second elastic arm 131, 132 are set in or pressed into the receiving space 123 via the pair of cuts 1241 on the hollow sleeve 12 to abut on and stop the spring 112 from releasing an upward elastic push force, so that the spring 112 is kept in a compressed state.

In the illustrated preferred embodiment, since the spring 112 set in the receiving space 123 is held down by the first and the second elastic arm 131, 132 of the spring stopper 13, the spring 112 could not elastically push or extend upward and is accordingly in the compressed state. When the first and the second elastic arm 131, 132 of the spring stopper 13 are no longer abutted on the top of the spring 112, the spring 112 would release its elastic force from its top end to provide an upward push force. Meanwhile, the bottom end of the spring 112 also provides a downward push force.

Figure 4:
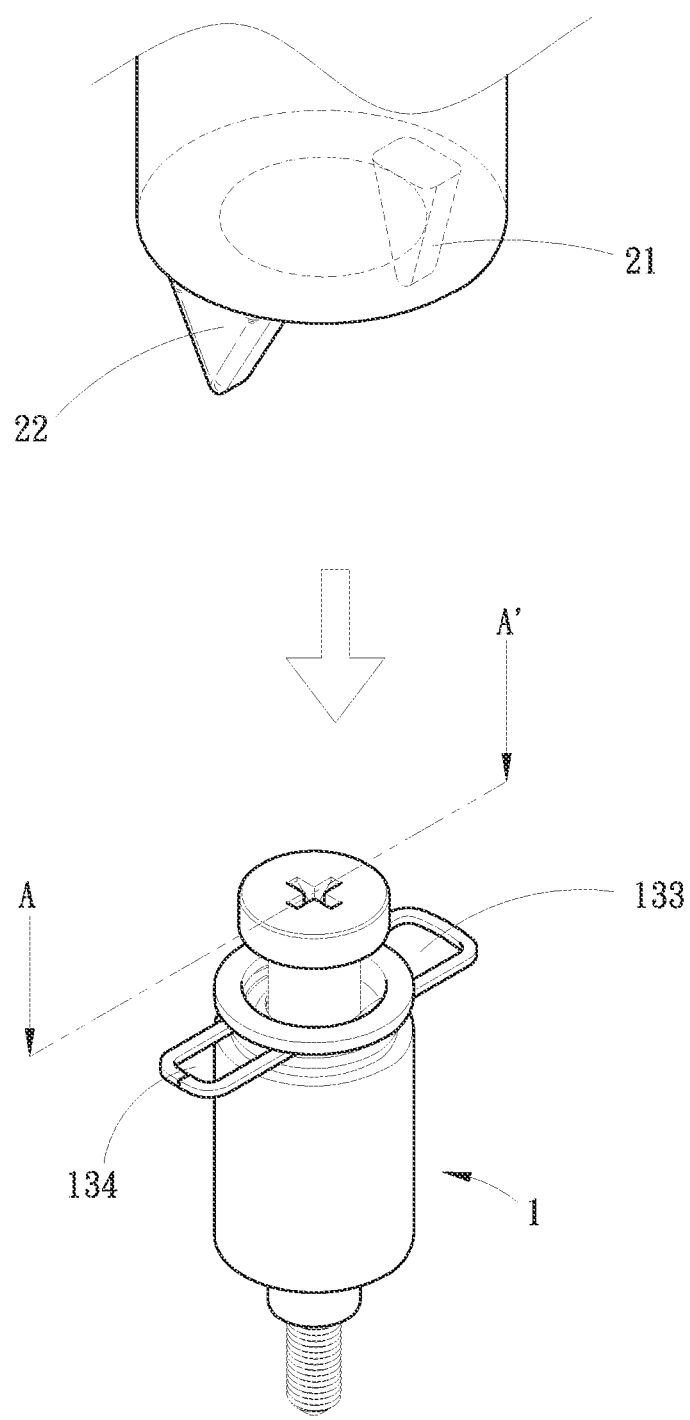
FIG. 4 is an exploded view showing a pressing tool is used to laterally push open a spring stopper included in the screw fixing structure of the present invention.
Figure 5:
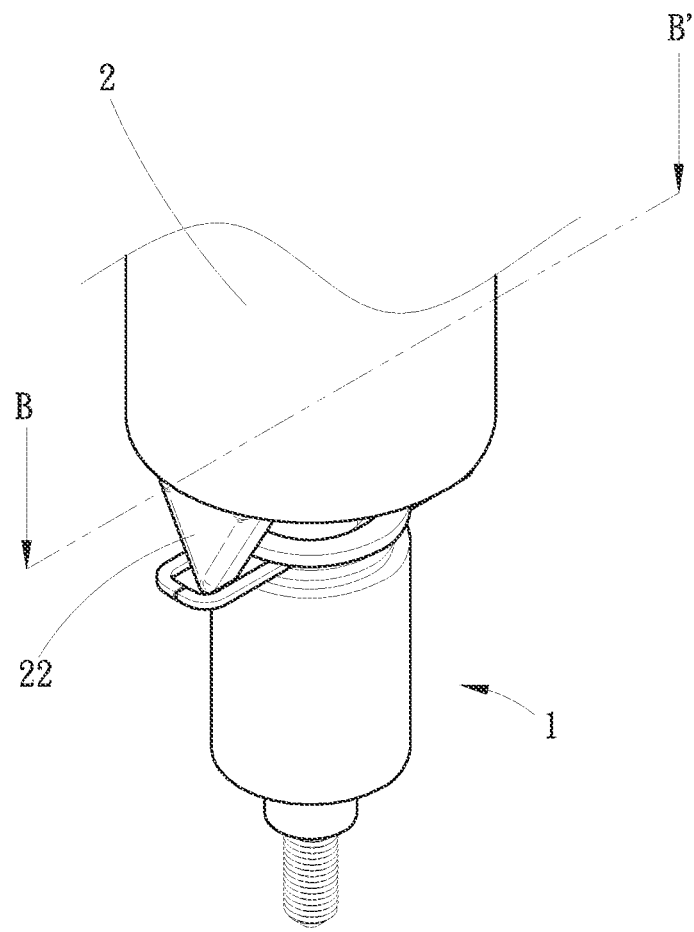
FIG. 5 is an assembled view of FIG. 4.
Figure 5A:
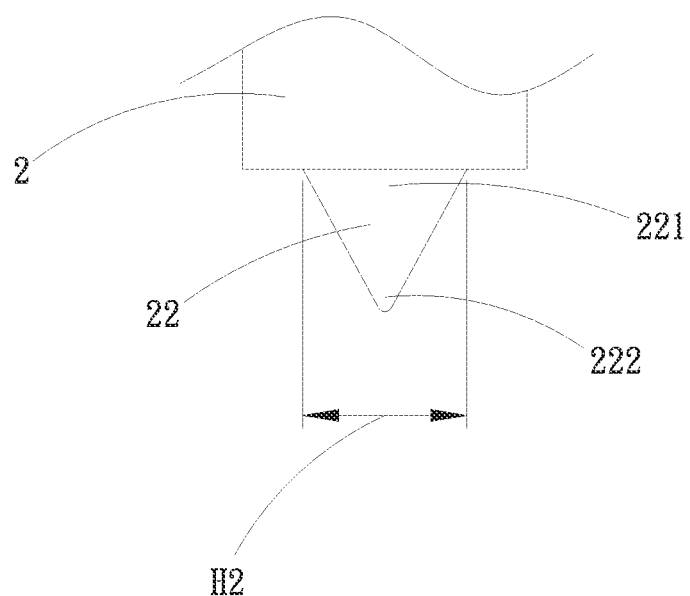
FIG. 5A shows an expanding section and a holding section of the pressing tool according to the present invention.
Figure 5A:
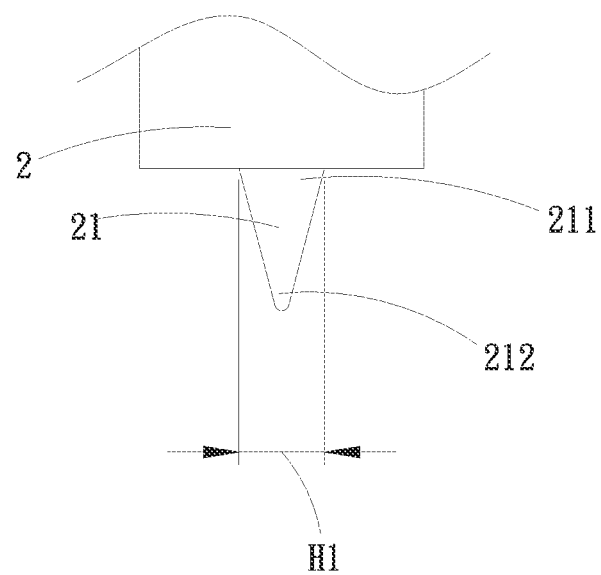

Please refer to FIGS. 1, 4 and 5A. The spring stopper 13 can be manipulated with a pressing tool 2, an end of which is provided with at least one holding section 21 and at least one expanding section 22. The expanding section 22 has a transverse width H2 larger than a transverse width H1 of the holding section 21. The holding section 21 and the expanding section 22 respectively have a fixed end 211, 221 connected to the pressing tool 2, and a free end 212, 222 located far away from the fixed end 211, 221. The holding section 21 and the expanding section 22 respectively have the largest transverse width H1, H2 at their fixed end 211, 221 and are tapered toward the free ends 212, 222, respectively, such that the free ends 212, 222 are formed into acute angles.

Figure 6:
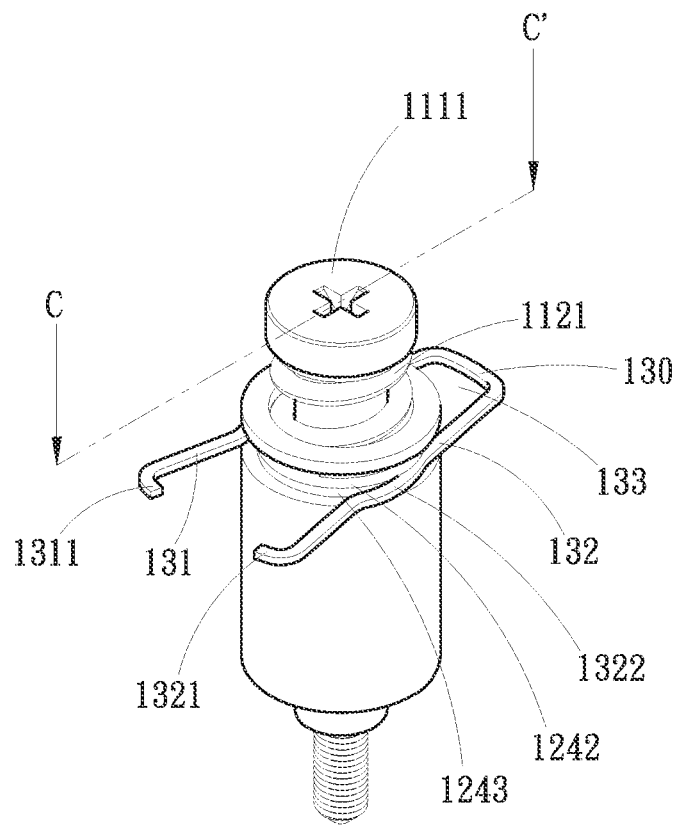
FIG. 6 shows the spring stopper of the present invention in a laterally pushed open state.
Figure 7C:
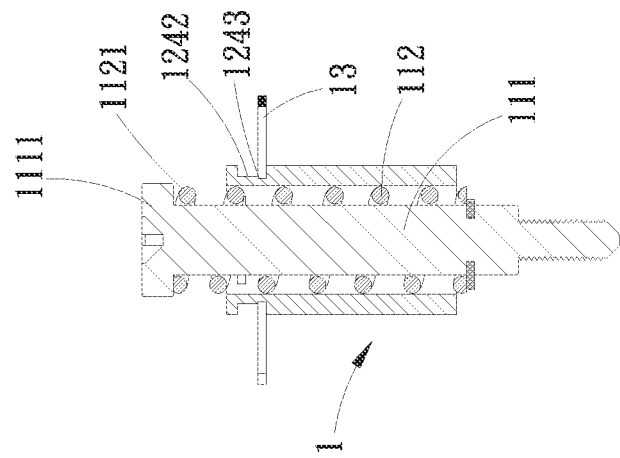
FIG. 7C is a sectional view taken along line C-C' of FIG. 6.
Figure 7B:
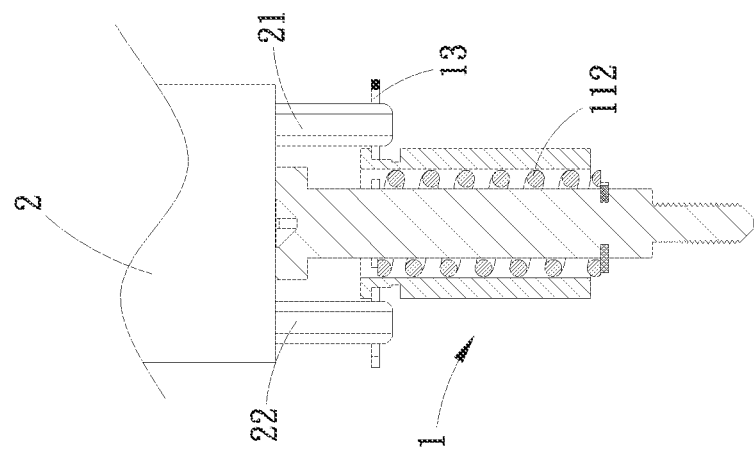
FIG. 7B is a sectional view taken along line B-B' of FIG. 5.
Figure 7A:
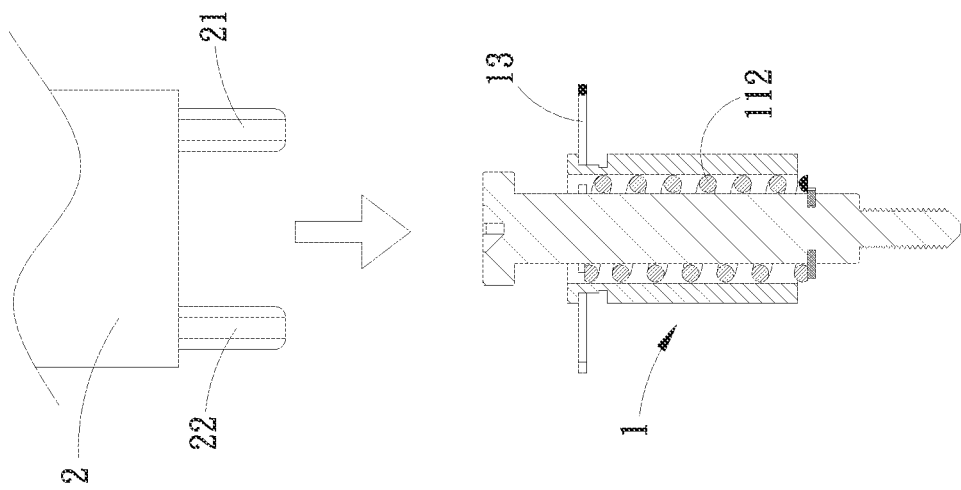
FIG. 7A is a sectional view taken along line A-A' of FIG. 4.

Please refer to FIGS. 1, 4 and 7A, as shown, the pressing tool 2 can be moved down toward the lower end 122 of the hollow sleeve 12. Further, as shown in FIGS. 1, 5 and 7B, the pressing tool 2 is moved downward until its holding section 21 is inserted into and retained to the first zone 133 of the spring stopper 13 while the expanding section 22 is inserted into the second zone 134 of the spring stopper 13. When the pressing tool 2 is further pushed toward the lower end 122 of the hollow sleeve 12, the first elastic arm 131 and the second elastic arm 132 of the spring stopper 13 are laterally pushed away from each other to increase a distance between the first end 1311 and the second end 1321. At this point, the spring 112 is no longer held down by the spring stopper 13, allowing the top end 1121 of the spring 112 to elastically release upward to press against a lower side of the head 1111 of the locating screw 11. As shown in FIGS. 6 and 7C, when being downward pushed by the pressing tool 2, the laterally pushed open spring stopper 13 with separated first and second ends 1311, 1321 is moved downward to finally stay in the first stepped section 1242 or the second stepped section 1243. Alternatively, the laterally pushed open spring stopper 13 may be directly removed from the hollow sleeve 12, lest it should cause inconvenience in subsequent mounting or machining of the screw fixing structure 1.

In some operable embodiments, the first stepped section 1242 is closer to the cuts 1241. When pushing the pressing tool 2 downward, it is possible to push the spring stopper 13 open and down to the first stepped section 1242 to thereby reduce the traveling distance of the downward pushed pressing tool 2. Alternatively, the pressing tool 2 may be downward pushed for the spring stopper 13 to be held in the second stepped section 1243. The second stepped section 1243 has a height smaller than those of the first stepped section 1242 and the hollow sleeve 12. When the spring stopper 13 is held in the second stepped section 1243, the spring stopper 13 is more stably pressed against the neck portion 124 of the hollow sleeve 12 without the risk of moving upward toward the first stepped section 1242 or moving downward toward the a joint between the neck portion 124 and the hollow sleeve 12 to fall off the screw fixing structure 1.

In some operable embodiments, at least one of the first elastic arm 131 and the second elastic arm 132 of the spring stopper 13 includes a convex section 1312, 1322. The convex section 1312 or 1322 forms a radially outward curve. When the spring stopper 13 is abutted on the top end 1121 of the spring 112, the convex section or sections 1312, 1322 having the curved configuration can fitly match a curved profile at the top end 1121 of the spring 112. Therefore, the spring stopper 13 can have an increased contact area with the top end 1121 of the spring 112, and the spring stopper 13 can more securely abut on and hold down the spring 112. When the spring stopper 13 is laterally pushed open and downward moved by the pressing tool 2, the curved convex section or sections 1312, 1322 on the first and/or the second elastic arm 131, 132 can be set in and in fitted contact with the first or the second stepped section 1242, 1243 of the hollow sleeve 12, enabling the laterally open spring stopper 13 to more securely associate with the hollow sleeve 12, and preventing the spring stopper 13 from springing out of hollow sleeve 12 when being moved downward and laterally pushed open by the pressing tool 2.

Figure 8:
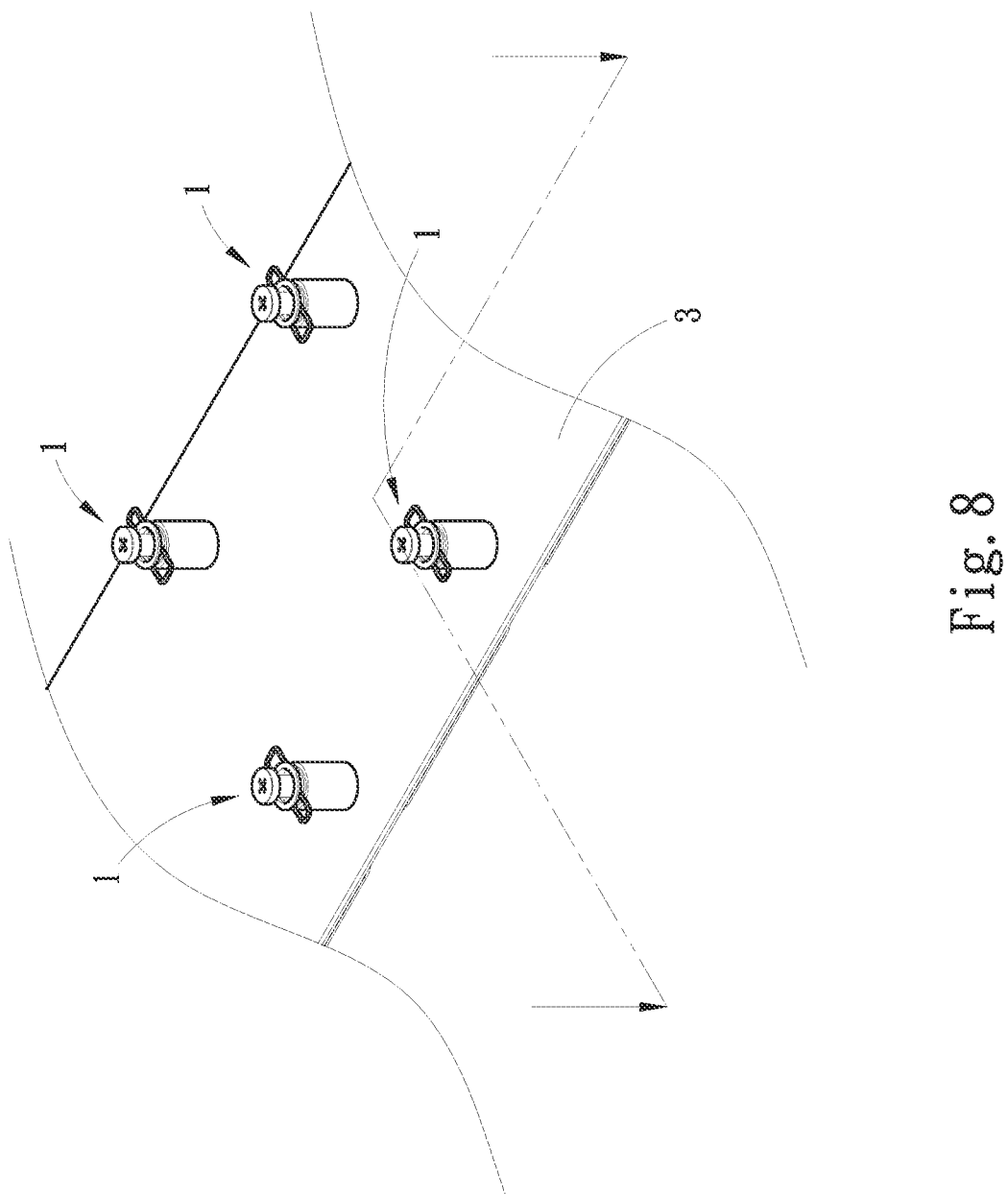
FIG. 8 is a perspective view of a heat dissipation unit of the present invention including a heat sink according to a first embodiment thereof.
Figure 9:
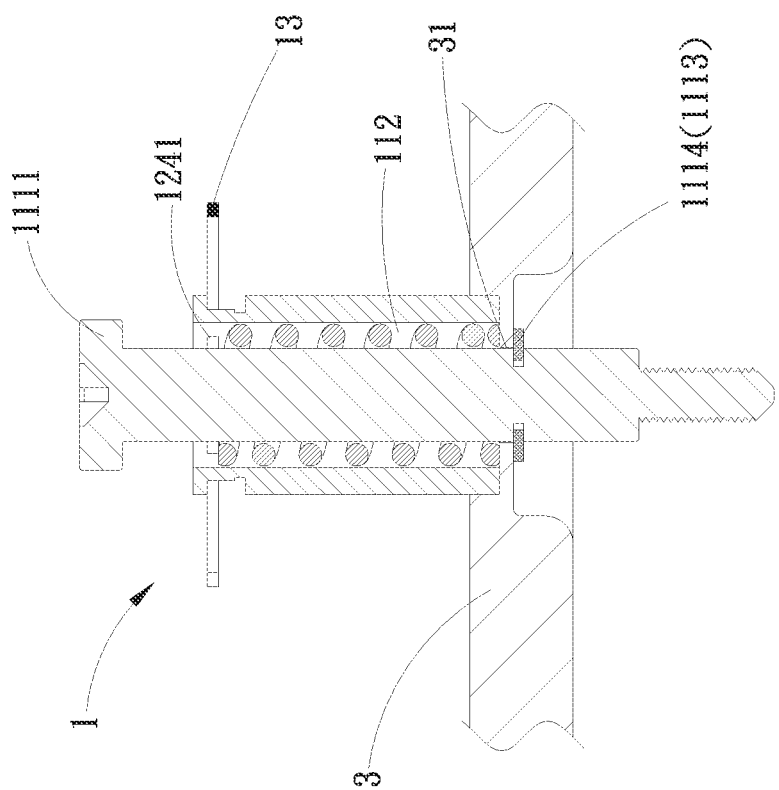
FIG. 9 is a sectional side view showing the heat dissipation unit of the present invention before the spring stopper is laterally pushed open.
Figure 10:
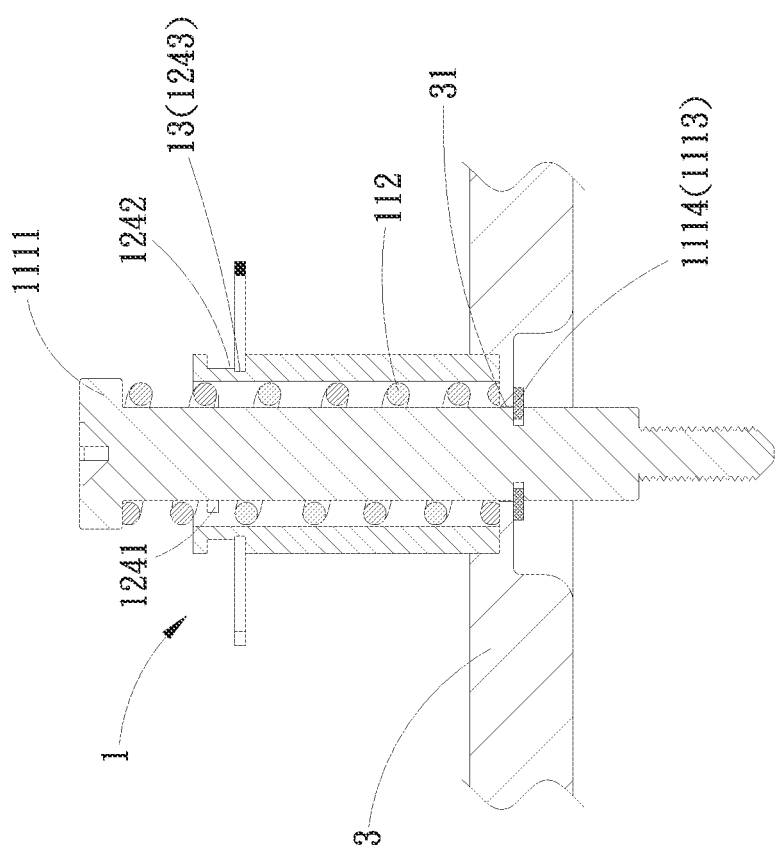
FIG. 10 is a sectional side view showing the heat dissipation unit of the present invention after the spring stopper is laterally pushed open.

Please refer to FIG. 8, which is a perspective view of a heat dissipation unit of the present invention according to a first embodiment thereof; and to FIGS. 9 and 10, which are sectional side views of the heat dissipation unit of the present invention before and after a spring stopper thereof is laterally pushed open, respectively. As shown, the heat dissipation unit of the present invention includes a heat sink 3 and a plurality of screw fixing structures 1. Each of the screw fixing structures 1 includes a spring stopper 13 and a spring 112 held to a compressed state by the spring stopper 13. The spring stoppers 13 can be synchronously laterally pushed open for the springs 112 to synchronously apply the same elastic forces to the heat sink 3.

The heat sink 3 has an upper surface, an opposite lower surface, at least four through holes 31, and a heat receiving zone 34. The through holes 31 are extended from the upper surface to the lower surface of the heat sink 3 and are located at four corners outside the heat receiving zone 34.

The screw fixing units 1 are generally the same as that being described above with reference to FIGS. 1 to 7C. However, in the heat dissipation unit of the present invention, the lower ends 122 of the hollow sleeves 12 and the bottom ends 1122 of the springs 112 are abutted on the upper surface of the heat sink 3 at locations corresponding to the through holes 31.

In some operable embodiments, the hollow sleeves 12 and the heat sink 3 are two individual and detachable elements. In this case, the lower ends 122 of the hollow sleeves 12 are abutted on the upper surface of the heat sink 3. In other alternative embodiments, the lower ends 122 of the hollow sleeves 12 are integrally formed with the upper surface of the heat sink 3 to form a one-piece structure.

After the locating screw 11 of the screw fixing structure 1 is extended through a corresponding through hole 31 on the heat sink 3, the retaining groove 1113 on the locating screw 11 is moved from the upper surface to the lower surface of the heat sink 3. At this point, the retaining ring 1114 can be fitted in the retaining groove 1113. With the retaining ring 1114, the screw fixing structure 1 is connected to the heat sink 3 and the locating screw 11 is prevented from separating from the heat sink 3.

The manner of assembling the heat dissipation unit is now explained with reference to the above description and the accompanying drawings.

First, the hollow sleeve 12 of each of the screw fixing structures 1 in the heat dissipation unit is set on the heat sink 3 above the corresponding through hole 31, and the spring 112 is placed in the receiving space 123 of the hollow sleeve 12 and partially compressed. Then, the spring stopper 13 is elastically tightly set in the pair of cuts 1241 on the hollow sleeve 12 to retain the spring 112 in the receiving space 123 of the hollow sleeve 12 and hold the spring 112 in a fully compressed state. Thereafter, each of the locating screws 11 is extended through the spring stopper 13, the spring 112, the hollow sleeve 12, and the corresponding through hole 31 on the heat sink 3, and the retaining ring 1114 is set in the retaining groove 1113 on the locating screw 11, so that the spring 112 maintains its compressed state in the hollow sleeve 12.

Then, the heat sink 3 is fixedly connected to a base 4 via the screw fixing structures 1. The base 4 is provided with at least four joining holes 41 and has at least one heat source set thereon. The four joining holes 41 are located at four corners outside the heat source and corresponding to the through holes 31 on the heat sink 3. The heat source may be, but not limited to, a computing chip 42 in the form of a bare die. The externally threaded sections 1112 on the locating screws 11 of the screw fixing structures 1 are screwed into the joining holes 41, such that the heat receiving zone 34 on the heat sink 3 is located above and in a light contact with the bare die computing chip 42 without applying any pressure thereto.

The screw fixing structures 1 of the heat dissipation unit are pushed downward by the pressing tool 2 in a manner generally the same as that having been described above with reference to FIGS. 7A, 7B and 7C with only one difference. That is, to connect the heat sink 3 to the base 4 via four locating screws 11, the pressing tool 2 used includes four pairs of holding section 21 and expanding section 22 corresponding to the four locating screws 11. The four pairs of holding section 21 and expanding section 22 are synchronously pressed downward, such that all the spring stoppers 13 are laterally pushed open at the same time, allowing all the springs 112 to restore from the compressed state with the top and the bottom ends of the springs 112 pressed against the lower side of the heads 1111 of the locating screws 11 and the heat sink 3, respectively. At this point, since the externally threaded sections 1112 of the locating screws 11 have already been screwed into the joining holes 41 on the base 4 and the springs 112 of the screw fixing structures 1 have their top ends 1121 pushed against the lower side of the heads 1111, the screw fixing structures 1 could not be elastically pushed upward any further and the springs 112 could not release all of their elastic force from its top ends 1121. This situation causes the bottom ends 1122 of the springs 112 to push downward against the heat sink 3. Since the springs 112 of the screw fixing structures 1 are synchronously released from the spring stoppers 13, the bottom ends 1122 of the springs 112 also synchronously provide even downward forces to the four corners outside the heat receiving zone 34 on the heat sink 3, allowing the heat sink 3 to fitly and closely contact with the bare die computing chip 42 on the base 4 under a specific pressure. Therefore, it is able to avoid the condition of broken or collapsed chip edges due to uneven forces applied to the bare die computing chip 42 or the occurrence of thermal resistance between the heat sink 3 and the bare die computing chip 42 due to incomplete contact between them. Further, the screw fixing structures 1 of the present invention can also prevent the bare die computing chip 42 from damage due to excessive downward pressure applied to the heat sink 3 in the process of tightening the locating screws 11.

Figure 11:
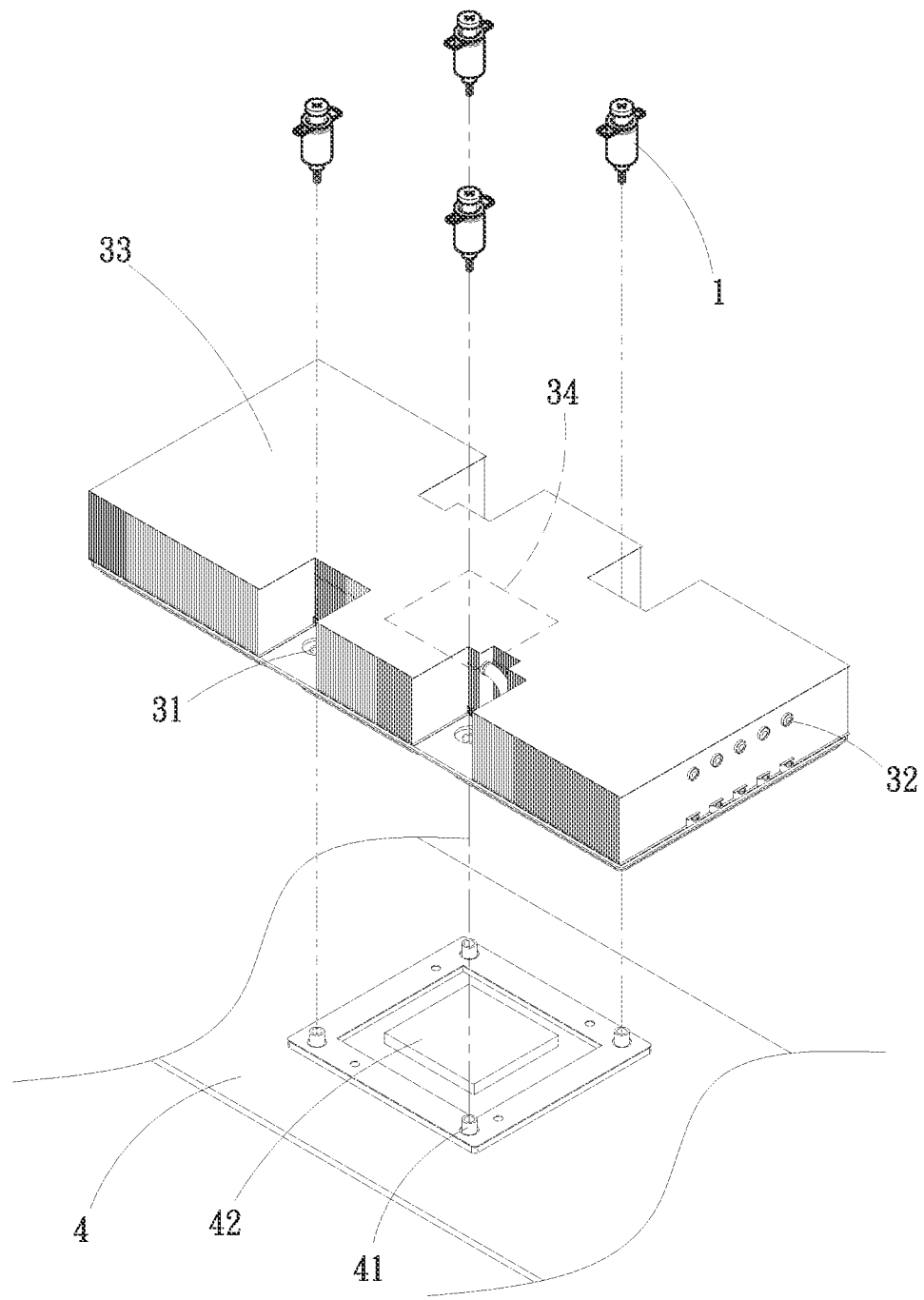
FIG. 11 is an exploded perspective view of the heat dissipation unit of the present invention including a heat sink according to a second embodiment thereof.
Figure 12:
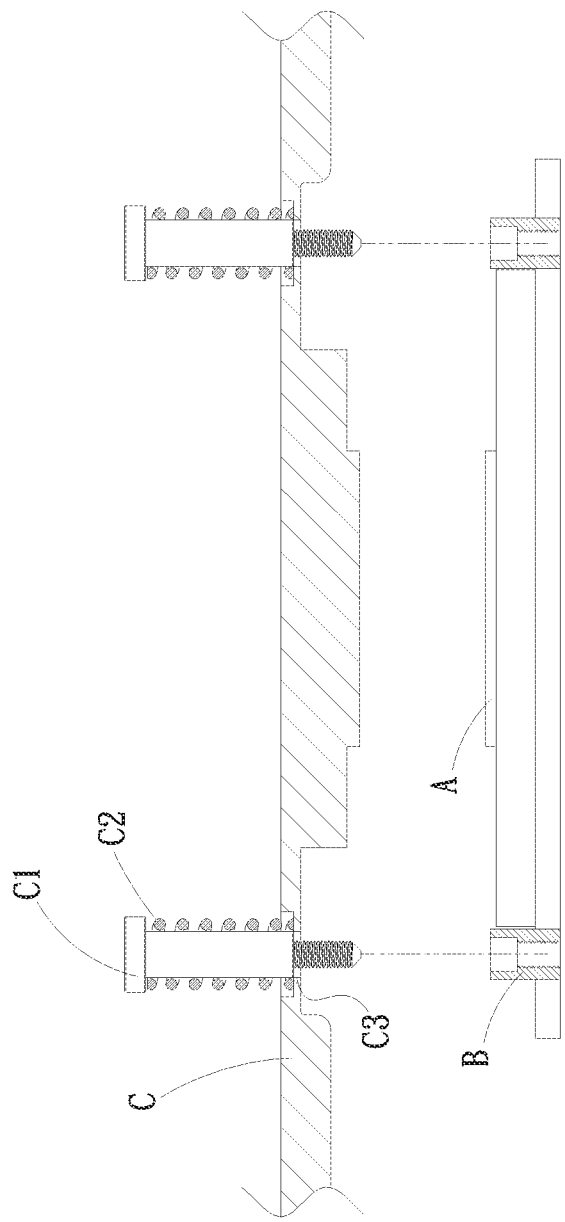
FIG. 12 shows how a heat dissipation device is connected to a bare die in the prior art.
Figure 13:
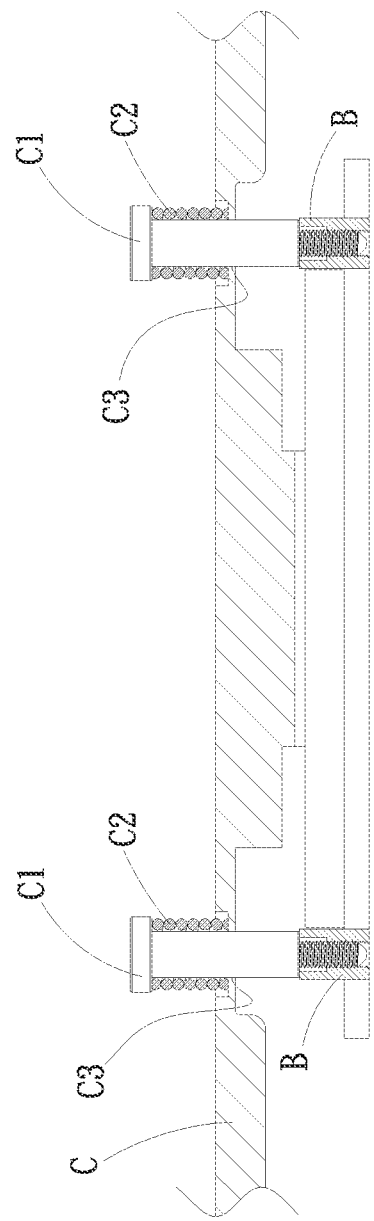
FIG. 13 shows the heat dissipation device and the bare die of FIG. 12 after being connected to each other.

In some operable embodiments, the heat sink 3 may be a vapor chamber, a heat pipe, or a combination of the vapor chamber and the heat pipe. Alternatively, a plurality of heat pipes 32, at least one radiating fin assembly 33, or a combination of the heat pipes 32 and the radiating fin assembly 33 may be provided on the upper surface of the heat sink 3. In a second embodiment of the heat sink 3 as shown in FIG. 11, a plurality of heat pipes 32 and a radiating fin assembly 33 are used with the heat sink 3. It is understood the above described embodiment is not intended to limit the present invention in any way. In the second embodiment of the heat sink 3, the heat pipes 32 respectively have an end flatly attached to the upper surface of the heat sink 3 to absorb heat energy collected by the heat sink 3; and another ends of the heat pipes 32 are extended through the radiating fin assembly 33 to provide the heat sink 3 an increased contact area with air, so as to dissipate the collected heat into air efficiently.

The present invention has been described with some preferred embodiments thereof and it is understood that many changes and modifications in the described embodiments can be carried out without departing from the scope and the spirit of the present invention that is intended to be limited only by the appended claims.

What is claimed is:

1. A screw fixing structure for heat dissipation unit, comprising:
   a locating screw including a shank having a head and an externally threaded section formed on an upper and a lower end thereof, respectively; the shank further including an annular retaining groove provided near the threaded section for receiving a retaining ring therein; and a spring being fitted on around the shank and having a top end and a bottom end, and the bottom end of the spring being elastically pressed against the retaining ring;
   a hollow sleeve having an open upper end, an open lower end, and a receiving space defined in the hollow sleeve between the upper and the lower end; the hollow sleeve further having a radially inward narrowed neck portion formed near the upper end; the neck portion having a pair of cuts correspondingly formed thereat, and the cuts being radially communicable with the receiving space; and the shank of the locating screw having the spring fitted around it, the locating screw with the spring together being axially extended through the hollow sleeve; and
   a spring stopper being elastically tightly set in the pair of cuts on the hollow sleeve and including a first and a second elastic arm, which are correspondingly shaped; the first elastic arm and the second elastic arm respectively having an end connected to one of two ends of a link section located between them and being pressed into the receiving space of the hollow sleeve via the pair of cuts to thereby restrain the top end of the spring.

2. The screw fixing structure for heat dissipation unit as claimed in claim 1, wherein the first and the second elastic arm respectively have another end, which are located far away from the link section and defined as a first and a second end; and the first and the second end being located closely adjacent to but not physically connected to each other.

3. The screw fixing structure for heat dissipation unit as claimed in claim 2, wherein the first elastic arm, the second elastic arm, the link section, the first end, and the second end of the spring stopper together enclose an area, and the enclosed area being divided by a virtual line into a first zone and a second zone.

4. The screw fixing structure for heat dissipation unit as claimed in claim 3, wherein the spring stopper can be manipulated with a pressing tool, an end of which is provided with a holding section and an expanding section; and the expanding section having a transverse width larger than that of the holding section.

5. The screw fixing structure for heat dissipation unit as claimed in claim 4, wherein the holding section and the expanding section respectively have a fixed end connected to the pressing tool and a free end located far away from the fixed end; and the holding section and the expanding section respectively having the largest transverse width at their fixed end and being tapered from the fixed end toward the free end, such that the free ends being formed into acute angles.

6. The screw fixing structure for heat dissipation unit as claimed in claim 5, wherein the neck portion of the hollow sleeve further includes a first stepped section and a second stepped section, which are located below the pair of cuts and can be radially communicable or not communicable with the receiving space of the hollow sleeve; the hollow sleeve having an outer diameter larger than that of the neck portion, and the first stepped section having an outer diameter larger than that of the second stepped section, such that the neck portion has an inverted stepped profile.

7. The screw fixing structure for heat dissipation unit as claimed in claim 6, wherein the pressing tool is movable down toward the lower end of the hollow sleeve to insert the holding section and the expanding section into the first and the second zone enclosed in the spring stopper, respectively, such that the first elastic arm along with the first end thereof and the second elastic arm along with the second end thereof are laterally pushed open to space from one another.

8. The screw fixing structure for heat dissipation unit as claimed in claim 7, wherein the laterally pushed open spring stopper no longer holds the spring to the compressed state, such that the top end of the spring releases an upward elastic force against the lower side of the head of the locating screw, and the laterally pushed open spring stopper being kept moved downward by the pressing tool to finally stay in one of the first and the second stepped section.

9. The screw fixing structure for heat dissipation unit as claimed in claim 8, wherein the first and the second elastic arm of the spring stopper respectively include a convex section having a radially outward curved configuration adapted to match a shape of the top end of the spring; and the curved configuration of the convex sections of the spring stopper after being laterally pushed open also being able to be fitly set in any one of the first and the second stepped section of the hollow sleeve.

10. A heat dissipation unit, comprising:
a heat sink having an upper surface, a lower surface, at least four through holes, and a heat receiving zone; and the through holes being extended from the upper surface to the lower surface of the heat sink and being located at four corners outside the heat receiving zone; and
a plurality of screw fixing structures respectively including a locating screw, a hollow sleeve, and a spring stopper;
the locating screw including a shank having a head and an externally threaded section formed on an upper and a lower end thereof, respectively; the shank further including an annular retaining groove provided near the threaded section; and a spring being fitted on around the shank and having a top end and a bottom end; and the top end and the bottom end of the spring being elastically pressed against the spring stopper and the heat sink, respectively;
the hollow sleeve having an open upper end, an open lower end, and a receiving space defined in the hollow sleeve between the upper and the lower end; the hollow sleeve further having a radially inward narrowed neck portion formed near the upper end; the neck portion having a pair of cuts correspondingly formed thereat, and the cuts being radially communicable with the receiving space; the hollow sleeve being disposed above a corresponding one of the through holes on the heat sink; and the shank of the locating screw having the spring fitted around it, the locating screw with the spring together being axially extended through the hollow sleeve; and
the spring stopper being elastically tightly set in the pair of cuts on the hollow sleeve and including a first and a second elastic arm, which are correspondingly shaped; the first elastic arm and the second elastic arm respectively having an end connected to one of two ends of a link section located between them and being pressed into the receiving space of the hollow sleeve via the pair of cuts to thereby restrain the top end of the spring.

11. The heat dissipation unit as claimed in claim 10, wherein, when the locating screws of the screw fixing structures have been extended through the corresponding through holes on the heat sink, a retaining ring is set in the retaining groove on each of the locating screws to prevent the locating screws from separating from the heat sink.

12. The heat dissipation unit as claimed in claim 10, wherein the heat sink is selected from the group consisting of a vapor chamber, a heat pipe, and a combination of the vapor chamber and the heat pipe; and the heat sink being able to further include a heat radiating fin assembly to contact with any one of the vapor chamber, the heat pipe, and the combination of the vapor chamber and the heat pipe to enable an upgraded heat dissipation efficiency.

13. The heat dissipation unit as claimed in claim 10, wherein the first and the second elastic arm respectively have another end, which are located far away from the link section and defined as a first and a second end; and the first and the second end being located closely adjacent to but not physically connected to each other.

14. The heat dissipation unit as claimed in claim 13, wherein the first elastic arm, the second elastic arm, the link section, the first end, and the second end of the spring stopper together enclose an area, and the enclosed area being divided by a virtual line into a first zone and a second zone.

15. The heat dissipation unit as claimed in claim 14, wherein the spring stoppers of the screw fixing structures can be manipulated with a pressing tool, an end of which is provided with at least four pairs of holding and expanding sections; and the expanding sections respectively having a transverse width larger than that of the holding sections.

16. The heat dissipation unit as claimed in claim 15, wherein the holding sections and the expanding sections respectively have a fixed end connected to the pressing tool and a free end located far away from the fixed end; and the holding sections and the expanding sections respectively having the largest transverse width at their fixed ends and being tapered from the fixed ends toward the free ends, such that the free ends being formed into acute angles.

17. The heat dissipation unit as claimed in claim 16, wherein the neck portion of the hollow sleeve of each screw fixing structure further includes a first stepped section and a second stepped section, which are located below the pair of cuts and can be radially communicable or not communicable with the receiving space of the hollow sleeve; the hollow sleeve having an outer diameter larger than that of the neck portion, and the first stepped section having an outer diameter larger than that of the second stepped section, such that the neck portion has an inverted stepped profile.

18. The heat dissipation unit as claimed in claim 17, wherein the pressing tool is movable down toward the lower ends of the hollow sleeves to insert the holding sections and the expanding sections into the first and the second zones enclosed in the spring stoppers, respectively, such that the first elastic arms along with the first ends thereof and the second elastic arms along with the second ends thereof are laterally pushed open to space from one another.

19. The heat dissipation unit as claimed in claim 18, wherein the laterally pushed open spring stoppers no longer hold the springs to the compressed state, such that the top ends of the springs respectively release an upward elastic force against the lower side of the heads of the locating screws, and the laterally pushed open spring stoppers being kept moved downward by the pressing tool to finally stay in one of the first and the second stepped sections.

20. The heat dissipation unit as claimed in claim 19, wherein the first and the second elastic arms of the spring stoppers respectively include a convex section having a radially outward curved configuration adapted to match a shape of the top end of the spring; and the curved configuration of the convex sections of the spring stoppers after being laterally pushed open also being able to be fitly set in any one of the first and the second stepped sections of the hollow sleeves.

* * * * *